(12) United States Patent
Wu et al.

(10) Patent No.: US 7,969,193 B1
(45) Date of Patent: Jun. 28, 2011

(54) DIFFERENTIAL SENSING AND TSV TIMING CONTROL SCHEME FOR 3D-IC

(75) Inventors: Wei-Cheng Wu, Hsin Chu (TW);
Yen-Huei Chen, Hsin Chu County (TW); Meng-Fan Chang, Taichung (TW)

(73) Assignee: National Tsing Hua University, Hsin Chu (TW)

( * ) Notice: Subject to any disclaimer, the term of this patent is extended or adjusted under 35 U.S.C. 154(b) by 0 days.

(21) Appl. No.: 12/830,469

(22) Filed: Jul. 6, 2010

(51) Int. Cl.
*H03K 19/0175* (2006.01)

(52) U.S. Cl. ............... 326/82; 326/41; 326/47; 257/758; 257/777; 716/119; 716/126

(58) Field of Classification Search .......... 326/37, 326/41, 47, 82; 257/758, 777; 716/118–119, 716/126

See application file for complete search history.

(56) References Cited

U.S. PATENT DOCUMENTS

| | | | | |
|---|---|---|---|---|
| 7,781,235 B2* | 8/2010 | Luo et al. | | 438/14 |
| 7,812,459 B2* | 10/2010 | Yu et al. | | 257/778 |
| 7,843,064 B2* | 11/2010 | Kuo et al. | | 257/758 |
| 2009/0001598 A1* | 1/2009 | Chiou et al. | | 257/777 |
| 2010/0031217 A1* | 2/2010 | Sinha et al. | | 716/10 |
| 2010/0153043 A1* | 6/2010 | Su et al. | | 702/71 |
| 2010/0200992 A1* | 8/2010 | Purushothaman et al. | | 257/758 |
| 2010/0257495 A1* | 10/2010 | Wu | | 716/5 |

* cited by examiner

*Primary Examiner* — Jason M Crawford
(74) *Attorney, Agent, or Firm* — Chih Feng Yeh; Huntington IP Consulting Co., Ltd.

(57) ABSTRACT

This disclosure uses a differential sensing and TSV timing control scheme for 3D-IC, which includes a first chip layer of the stacked device having a detecting circuits and a relative high ability driver horizontally coupled to the detecting circuits. A sensing circuit is coupled to the detecting circuits by a horizontal line, a first differential signal driver is coupled to the sensing circuit, horizontally. The Nth chip layer of the stacked device includes a Nth relative high ability driver and a Nth differential signal driver formed on the Nth chip layer. The Nth relative high ability driver is vertically coupled to the first relative high ability driver through one relative low loading TSV and (N−2) TSVs to act as dummy loadings. The TSV and (N−2) TSVs penetrate the stacked device from Nth chip layer to first chip layer. The TSV shares same configuration with the (N−2) TSVs. The Nth differential signal driver is vertically coupled to the first differential signal driver through a pair of TSVs and (N−2) pairs of TSVs, vertically. The pair of TSVs and the (N−2) TSVs penetrate the stacked device from the Nth chip layer to the first chip layer. Each of TSV is formed between a first and a second chip layers. Each of TSV is formed between any adjacent two chip layers of the stacked device.

20 Claims, 4 Drawing Sheets

DIFFERENTIAL SENSING AND TSV TIMING CONTROL SCHEME FOR 3D-IC

TECHNICAL FIELD

The present invention generally relates to a 3D stacked chip device, and especially to a differential sensing and TSV timing control scheme for 3D-IC.

RELATED ART

Recently, portable electronic equipment such as mobile telephones and non-volatile semiconductor memory media such as IC memory cards have been downsized, and there have been increasing demands for reducing the number of parts used in the equipment and media and downsizing thereof. Therefore, in the semiconductor industry, packaging technologies for integrated circuits (ICs) have been advancing to meet requirements for miniaturization and mounting reliability. For example, the requirement for miniaturization results in acceleration of technological development for a package having a similar size in relation to a semiconductor chip. Further, the requirement for mounting reliability places importance on packaging technologies that are capable of enhancing efficiency of a mounting process and improving mechanical and electrical reliability after the mounting process is completed. Thus, there have been considerable activities in the development of efficiently packaging a semiconductor chip. As packages that meet the demands, there are a chip scale package (CSP) having a package size substantially equal to that of the semiconductor chip, a multi-chip package (MCP) in which multiple semiconductor chips are incorporated into a single package, and a package-on-package (POP) in which multiple packages are stacked and combined into a single-piece member.

In pace with the development of technology, in response to an increase in storage capacity required for memory and the like, stacked type semiconductor devices (multichip devices) have been proposed which have semiconductor integrated circuit chips stacked together. Namely, there is provided a stacked type semiconductor device formed of at least two semiconductor integrated circuit devices stacked, each having a specification and including a semiconductor integrated circuit chip, wherein each of the semiconductor integrated circuit devices includes a conductor that penetrates the semiconductor integrated circuit device, and the semiconductor integrated circuit devices are electrically connected by the conductors and a value of the specification, excluding a size, of the uppermost semiconductor integrated circuit device or the lowermost semiconductor integrated circuit device is maximum or minimum. Consequently, the stacked type semiconductor device has a plurality of chips stacked in a vertical direction. In the stacked type semiconductor device, the chips are electrically connected together via, for example, through plugs that penetrate the chips. Thus, to select a desired one of the stacked memory chips of the same structure is an important task. If a stacked type semiconductor device is manufactured, chips may be individually subjected to operation tests so that only normal chips can be sorted out and stacked.

One of the technologies to offer vertical connection is called Through-Silicon-Via (TSV) which has emerged as a promising solution in 3-D stacked devices. It is a technology where vertical interconnects are formed through the wafer to enable communication among the stacked chips. One of the related article may refer to IEEE, JOURNAL OF SOLID-STATE CIRCUITS, VOL. 45, NO. 1, JANUARY 2010, entitled: "8 Gb 3-D DDR3 DRAM Using Through-Silicon-Via Technology". In the article, a 3-D DRAM with TSVs is proposed which overcomes the limits of conventional module approaches. It also discloses how the architecture and data paths were designed. 3-D technologies including TSV connectivity check and repair scheme, and power noise reduction method are also disclosed. TSVs can be formed simply after fab-out so that no special process integration during the normal process flow is required. Chip identification (ID) is typically assigned.

In data communication systems, it typically utilizes a transmitting device that operates under control of a first clock and an independent receiving device that operates under control of a second clock. In general, the transmitting device and the receiving device have a clock rate difference. This clock rate difference causes the receiver to see the incoming data at either faster or slower than expected, hereafter referred to as "timing drifting".

For packet based communication systems, if the amount of the maximum possible timing drift during the packet is much smaller than a symbol period, then this clock rate difference can be ignored. U.S. Pat. No. 7,003,056 disclosed a symbol timing tracking and method, and it uses timing tracking to correct timing drifting due to the difference in frequency of a transmitter clock and a receiver clock. With the timing tracking, correlation values of three consecutive samples are calculated using the receive signal and the recovered symbols and then summed.

Further, SRAMs are widely used in applications where speed is of primary importance, such as the cache memory typically placed proximate to the processor or Central Processing Unit (CPU) in a personal computer. However, the timing of its internal circuitry may critically affect the speed and efficiency of the SRAM. For example, the bit line precharge interval comprises an appreciable portion of the read/write cycle time, and sense amplifier usage contributes significantly to the overall power consumption of the SRAM. In early SRAM memory designs, all read/write cycle timing was based on an externally generated clock signal.

Another related art disclosed in U.S. Pat. No. 6,643,204 which includes self-time circuit for reducing the write cycle time in a semiconductor memory. A "dummy" memory cell having the same timing requirements as the functional cells, and associated write logic are added to the standard circuitry of the memory device. The dummy write cell receives the same control signals used to write data to the functional cells of the memory, and is configured to issue a completion signal when a write access is concluded, causing the write cycle to be terminated. The circuit and method permits write cycle time to be reduced to the lowest practical value, independently of the read cycle time. This potentially increases the overall operating speed of the memory device.

The present invention provides a differential sensing and TSV timing control for 3D stacked device to improve the loading issue as shown in FIG. 1. The delay caused by the loading issue is worse to the higher level chip layers. Therefore, the present invention provides a novel method for 3D-IC sensing and timing tracking to solve issue.

SUMMARY

An aspect of the present invention is to provide a method and a scheme for 3D-IC Differential Sensing and TSV timing control.

The differential sensing and TSV timing control for 3D-IC comprises a relative high ability driver (buffer); a dummy loading coupled to the relative high ability driver to transmit a timing strobe signal; a detecting circuit coupled to the dummy loading. A differential signal generating structure is coupled to a relative low ability driver (buffer) to generate a differential signal. A sensing circuit is coupled to the differential signal generating structure. The detecting circuit activates the sensing circuit when an active signal reaches to a trigger point.

The differential signal generating structure includes a pair of high loading structures coupled to the relative low ability driver; an inverter arranged between one of the pair of high loading structures and the relative low ability driver. The pair of high loading structures includes a pair of through-silicon-vias. The dummy loading structure includes a through-silicon-via.

The signal transmitting speed of the relative high ability driver is higher than the one of the relative low ability driver. In one embodiment, the signal transmitting speed of the relative high ability driver is x-times to the relative low ability driver. The detecting circuit includes at least one inverter, and the sensing circuit includes a sense amplify or comparator or operational amplifier.

Under the scheme of three dimension aspect, the differential sensing and TSV timing control scheme for a stacked device having pluralities chip layers includes a first chip layer having a detecting circuits and a relative high ability drive horizontally coupled to the detecting circuits. A sensing circuit is coupled to the detecting circuits by a horizontal conductive line and a first differential signal driver coupled to the sensing circuit, horizontally. A Nth chip layer of the stacked device includes a Nth relative high ability driver and a Nth differential signal driver formed on the Nth chip layer; wherein the N is a nature number and is more than one; wherein the Nth relative high ability drive is vertically coupled to the first relative high ability drive through one relative low loading TSV and (N−2) relative high loading TSV to act dummy loadings, all of the relative low loading TSV and (N−2) relative high loading TSV penetrate the stacked device from the Nth chip layer to the first chip layer, wherein the relative low loading TSV and the (N−2) relative high loading TSVs are formed in a shared configuration; wherein the Nth differential signal driver is vertically coupled to the first differential signal driver through a pair of relative low loading TSVs and (N−2) pairs of relative high loading TSVs, vertically, each pair of relative low loading TSVs and the (N−2) relative high loading TSVs penetrates the stacked device from top to bottom; and each the relative low loading TSV is formed between a first and a second chip layers, and each the relative high loading TSV is formed between any adjacent two chip layers of the stacked device; whereby the detecting circuit activates the sensing circuit when an active signal reaches to a trigger point.

DETAILED DESCRIPTION

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

Figure 1:
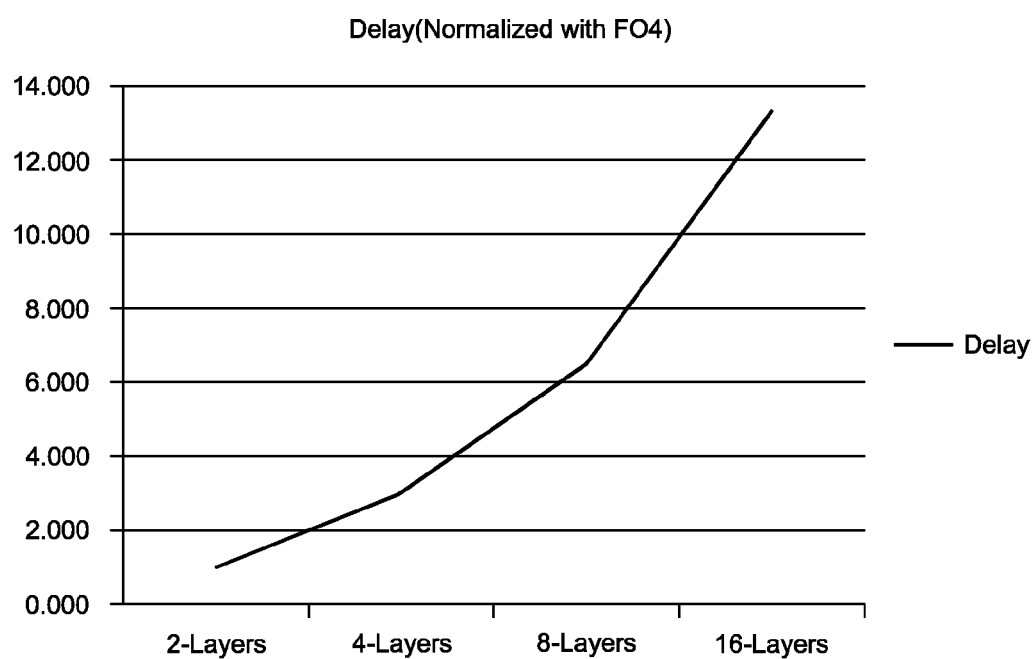
FIG. 1 shows a loading issue in 3D-IC according to prior art.
Figure 2:
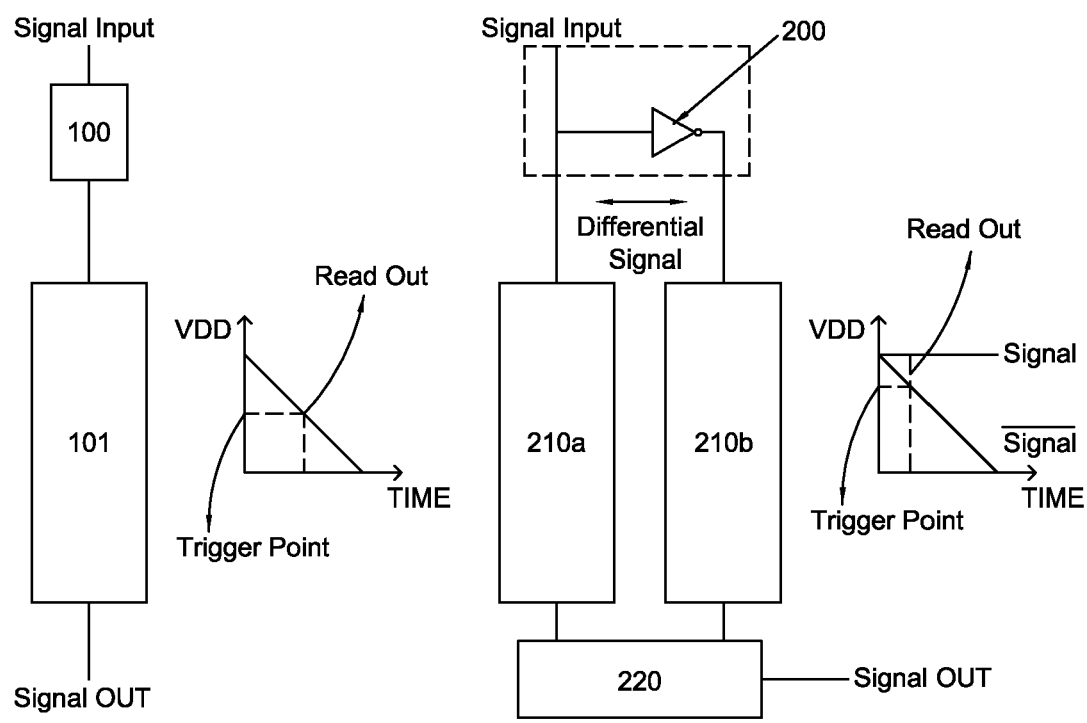
FIG. 2 shows a functional diagram of the differential sensing and TSV timing control scheme for 3D-IC of the present invention.

The present invention generally relates to a 3D-IC differential sensing and TSV timing control scheme which can be introduced to an embedded volatile or nonvolatile memory. In a preferred embodiment of the present invention, as shown in FIG. 2, the present invention discloses a differential sensing scheme which includes a drive or buffer 100 coupled to a first high loading structure 101.

A signal input is coupled to another terminal of the drive (buffer) 100, a signal output is electrically connected to the first high loading structure which can be formed by TSV 101. The scheme further includes a second high loading structure (TSV) 210a and a third high loading structure (TSV) 210b, both of the second TSV 210a and the third TSV 210b may be arranged in a parallel scheme for design consideration. Other configuration is also available. The signal input is coupled to the second TSV 210a and an inverter 200 is arranged between the signal input and the third TSV 210b. Subsequently, a sensing circuit 220 is coupled to both of the second TSV 210a and the third TSV 210b, respectively.

The signal out is coupled to another terminal of the sensing circuits 220. It also shows the VDD-timing diagram as set in FIG. 2 for the differential sensing scheme, respectively. For the first TSV 101, the trigger point is at the half of the VDD, if the trigger point is extended horizontally to reach the point A of the VDD-timing diagram, the read out time is the cross point between the time axis with the vertical extending line from point A. Similarly, for the second TSV 210a and the third TSV 210b, the sensing margin is higher than the trigger point, namely, higher than the half VDD. Therefore, the read out will be over the line of VDD-time, which is between the signal line and the line of VDD-time.

Figure 3:
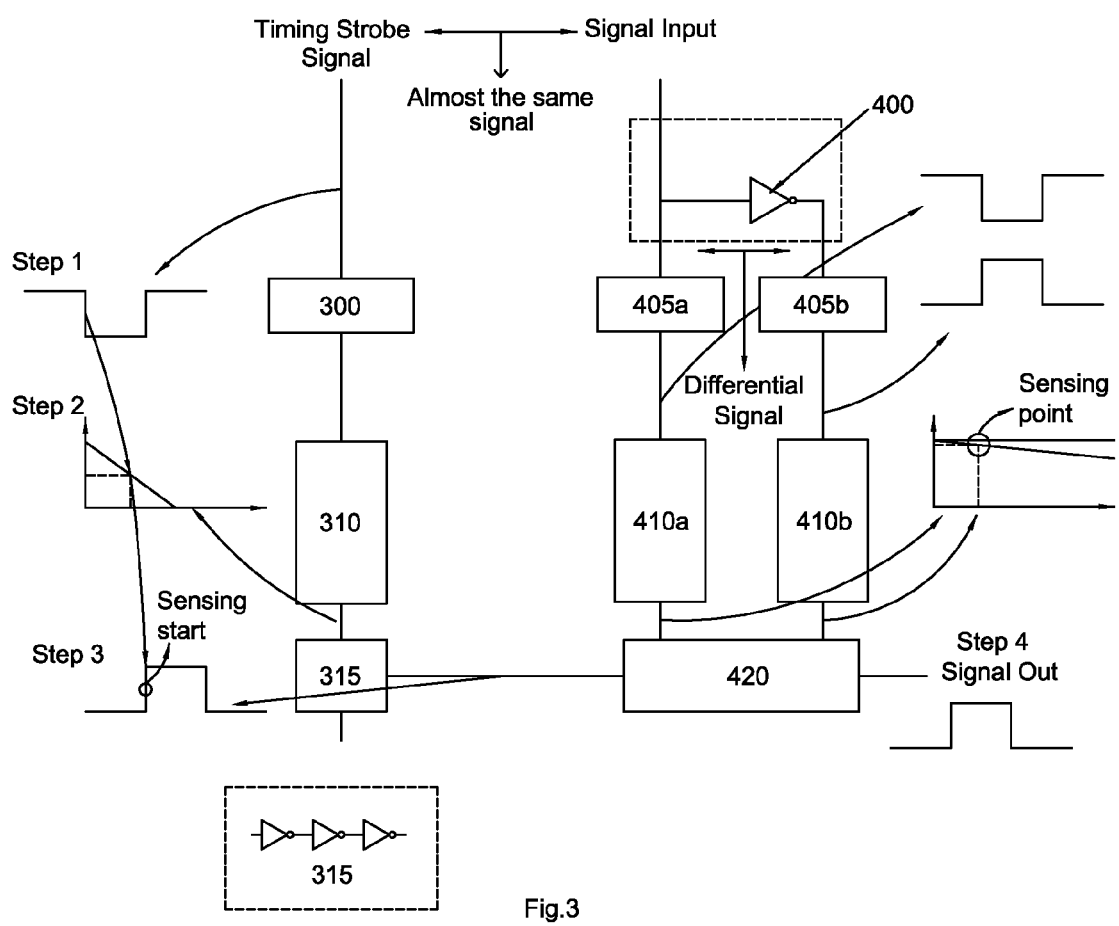
FIG. 3 shows a functional diagram of the differential sensing and TSV timing control scheme for 3D-IC of the present invention.

Please refer to FIG. 3, it illustrate a preferred embodiment of the present invention. It shows the TSV timing control for different sensing, the scheme includes a relatively high level drive (or buffer) 300 coupled to a dummy TSV (dummy loading) 310 with high loading. A timing strobe signal input is coupled to another terminal of the drive (buffer) 300, a detecting circuit 315 is electrically connected to the dummy TSV (dummy loading) 310. The differential signal structure includes a pair of high loading structures, in one example, the pair of high loading structures can be formed by a pair of TSV 410a and TSV 410b, the pair of the TSV 410a and the TSV 410b are coupled to the signal input through two relatively low level drivers (buffers) 405a and 405b, respectively.

It should be noted that an inverter 400 is arranged between the signal input and the relatively low level driver (buffer) 405b. Subsequently, a sensing circuit 420 is coupled to both of the pair of the high loading structure, respectively. The signal out is coupled to another terminal of the sensing circuit 420. The aforementioned detecting circuit 315 is coupled to the sensing circuit 420. Preferably, the timing strobe signal is almost the same with the signal input. In one embodiment, the performance of the relatively high level drive (or buffer) 300 is x-time ability to the relatively low level driver (buffer) 405a or 405b.

Referring to FIG. 3 again, the following illustrates the TSV timing control for the differential sensing. An initial step is to input timing strobe signal to the relatively high ability drive (or buffer). The true signal is input to the relative low ability drivers 405a and 405b. The signal through the inverter 400 will be inverted from the initial input signal and be delay, the inverted signal wave shape can be seen from the right upper portion of FIG. 3. Therefore, the signal to the high loading structure 410b via the inverter 400 will be inverted. On the contrary, the signal to another one high loading structure 410a without the inverter will remain the same. The sensing circuit 420 is normally closed. It will be transmitted by differential signal due to the loading is heavy. After the difference of the differential signal is above 100 mV, followed by opening the sensing circuit 420, thereby determining the digital status is one or zero.

The 100 mV difference is determined by the circuit having the dummy loading 310 coupled to the detecting circuit 315. The VDD-time diagram can be referred to the diagram set in FIG. 2, and FIG. 3. The diagram indicates that the signal passing through the dummy loading 310. The VDD-time diagram at the outputs of the pair of the high loading structures 410a, 410b is illustrated at the right side of the FIG. 2 and FIG. 3. A dummy signal is duplicated by the dummy loading 310 to transmit a well known active signal and an x-time ability driver 300 is introduced into the dummy loading 310. Assuming that the VDD is 1.8V, and the trigger point is half of the VDD, namely, 0.9V. Consequently, when the different of the differential signal is over 100 mV, while the signal of the dummy loading reaches the trigger point, thus, the value of x is 9. It means that the transmitting speed of the dummy loading 310 is higher than the one of the pair of differential signal structure. Similarly, if the VDD is 1V, then the x is equal to 5.

When the active signal reaches the trigger points at step 2 in FIG. 3, the detecting circuit 315 should open the sensing circuit 420 as sooner as possible. In one preferred embodiment, the detecting circuit 315 is formed by at least one inverter to detect the generated pulse as set at step 3 in FIG. 3. The most important one is that the inverters have to fit the sensing timing. The sensing circuit 420 could be a sense amplifier or a comparator or an operational amplifier. Finally, the signal is output from the sensing circuit as set at step 4 in FIG. 3. The loading issue may be easily overcome by the TSV timing control and differential sensing scheme.

Figure 4:
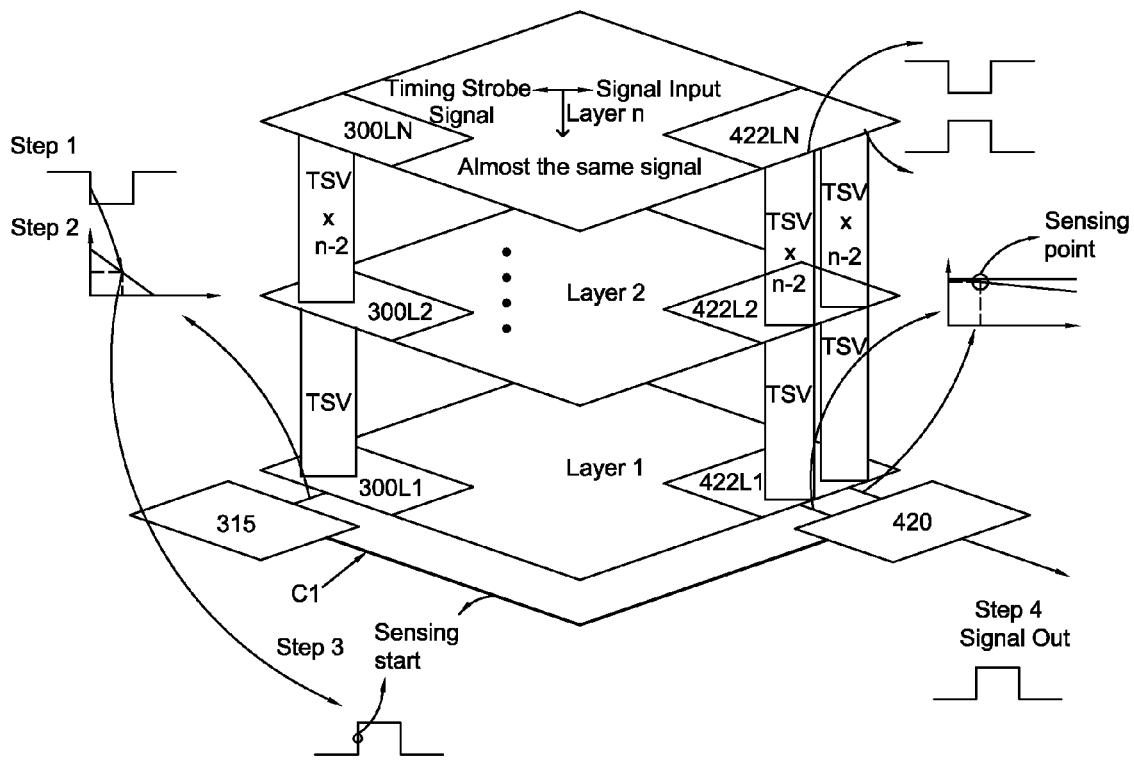
FIG. 4 shows a three dimensions views of the differential sensing and TSV timing control scheme for 3D-IC of the present invention.

FIG. 4 illustrates the three dimension configuration of the present invention, the 3D stacked device includes pluralities of stacked chip layer which includes an individual chip (not shown) located at each chip layer. The first chip layer (Layer 1) of the 3D stacked device includes a detecting circuits 315 located within a predetermined area, a relative high ability drive 300L1 is horizontally coupled to the detecting circuits 315. A sensing circuit 420 is arranged at a predetermined area of the first chip layer and coupled to detecting circuits 315 by a horizontal conductive line C1. A first differential signal driver 422L1 is coupled to the sensing circuit 420, horizontally.

The configuration of other chip layers of the stacked device is similar to the one of the first chip layer but without the detecting circuit 315 and the sensing circuit 420. The Nth chip layer (layer n) of the 3D stacked device also includes a Nth relative high ability driver 300LN located on assigned area of the Nth chip layer and a Nth differential signal driver 422LN is arranged on the Nth chip layer as well; N is a nature number and is more than one. The Nth relative high ability drive 300LN is vertically coupled to the first relative high ability drive 300L1 through one vertical relative low loading TSV and (N−2) relative high loading TSVs which are indicated by TSV x (N−2) in the FIG. 4, all of the vertical relative low loading TSV and the (N−2) relative high loading TSVs penetrate the stacked device from top to bottom, wherein the relative low loading TSV and the (N−2) relative high loading TSVs are formed in a shared configuration. Similarly, the Nth differential signal driver 422LN is also vertically coupled to the first differential signal driver 422 L1 through one pair of relative low loading TSVs and (N−2) pairs of relative high loading TSVs, vertically, all of the vertical relative low loading TSVs and (N−2) relative high loading TSV penetrates the stacked device from the Nth chip layer to the first chip layer.

It should be noted that each relative low loading TSV is formed between the first and the second chip layers. The (N−2) relative high loading TSVs are formed between any adjacent two chip layers of the stacked device except between first and the second chip layers. The mechanism and the operation method are already illustrated above and set in FIG. 3 and FIG. 4. Thus, the redundancy description is omitted.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A differential sensing and TSV timing control scheme for a stacked device having pluralities chip layers, comprising:
   a first chip layer of said stacked device including a timing-detecting circuit and a relative high ability driver at the same chip layer horizontally coupled to said timing-detecting circuit;
   a sensing circuit coupled to said timing-detecting circuit in said first chip layer by a horizontal conductive line;
   a first differential signal driver coupled to said sensing circuit horizontally in said first chip layer;
   a Nth chip layer of said stacked device includes a Nth relative high ability driver and a Nth differential signal driver formed on said Nth chip layer; wherein said N is a nature number and is more than one; wherein said Nth relative high ability driver is vertically coupled to said first relative high ability driver through one relative low loading TSV and (N−2) relative high loading TSVs to act dummy loadings, said relative low loading TSV and said (N−2) relative high loading TSVs penetrating said stacked device from said Nth chip layer to said first chip layer, wherein said relative low loading TSV and said (N−2) relative high loading TSVs are formed in a shared configuration; wherein said Nth differential signal driver is vertically coupled to said first differential signal driver through a pair of relative low loading TSVs and (N−2) pairs of relative high loading TSVs, vertically, said pair of relative low loading TSVs and said (N−2) relative high loading TSVs penetrating said stacked device from said Nth chip layer to said first chip layer; and each said relative low loading TSV being formed between said first and a second chip layers, each said relative high loading TSV being formed between any adjacent two chip layers of said stacked device; whereby said detecting circuit activates said sensing circuit when an active signal reaches to a trigger point.

2. The scheme according to claim 1, further comprising a relative low ability driver and an inverter arranged between one of said Nth pair of relative high loading TSV and said relative low ability driver.

3. The scheme according to claim 2, wherein signal transmitting speed of said relative high ability driver is higher than the one of said relative low ability driver.

4. The scheme according to claim 3, wherein signal transmitting speed of said relative high ability driver is x-times to said relative low ability driver, wherein said x depends on said sensing circuit's sensing margin and x must be larger than 1.

5. The scheme according to claim 1, wherein said timing-detecting circuit includes at least one inverter.

6. The scheme according to claim 1, wherein said sensing circuit includes a sense amplifier.

7. The scheme according to claim 1, wherein said sensing circuit includes a comparator.

8. The scheme according to claim 1, wherein said sensing circuit includes an operational amplifier.

9. The scheme according to claim 1, wherein said one relative low loading TSV and said (N−2) relative high loading TSV are coupled to a timing strobe signal.

10. The scheme according to claim 1, wherein said pair of relative low loading TSVs and said (N−2) pairs of relative high loading TSVs are coupled to a input signal.

11. A differential sensing and TSV timing control scheme for a stacked device having pluralities chip layers, comprising:
  a first chip layer of said stacked device including a detecting circuits and a relative high ability buffer horizontally coupled to said detecting circuits;
  a sensing circuit coupled to said detecting circuits by a horizontal conductive line;
  a first differential signal buffer coupled to said sensing circuit, horizontally;
  a Nth chip layer of said stacked device includes a Nth relative high ability buffer and a Nth differential signal buffer formed on said Nth chip layer; wherein said N is a nature number and is more than one; wherein said Nth relative high ability buffer is vertically coupled to said first relative high ability buffer through one relative low loading TSV and (N−2) relative high loading TSVs to act dummy loadings, said relative low loading TSV and said (N−2) relative high loading TSVs penetrating said stacked device from said Nth chip layer to said first chip layer, wherein said relative low loading TSV and said (N−2) relative high loading TSVs are formed in a shared configuration; wherein said Nth differential signal buffer is vertically coupled to said first differential signal buffer through a pair of relative low loading TSVs and (N−2) pairs of relative high loading TSVs, vertically, said pair of relative low loading TSVs and said (N−2) relative high loading TSVs penetrating said stacked device from said Nth chip layer to said first chip layer; and each said relative low loading TSV being formed between said first and a second chip layers, each said relative high loading TSV being formed between any adjacent two chip layers of said stacked device; whereby said detecting circuit activates said sensing circuit when an active signal reaches to a trigger point.

12. The scheme according to claim 11, further comprising a relative low ability buffer and an inverter arranged between one of said Nth pair of relative high loading TSV and said relative low ability driver.

13. The scheme according to claim 12, wherein signal transmitting speed of said relative high ability buffer is higher than the one of said relative low ability driver.

14. The scheme according to claim 13, wherein signal transmitting speed of said relative high ability buffer is x-times to said relative low ability driver.

15. The scheme according to claim 11, wherein said detecting circuit includes at least one inverter.

16. The scheme according to claim 11, wherein said sensing circuit includes a sense amplifier.

17. The scheme according to claim 11, wherein said sensing circuit includes a comparator.

18. The scheme according to claim 11, wherein said sensing circuit includes an operational amplifier.

19. The scheme according to claim 11, wherein said one relative low loading TSV and said (N−2) relative high loading TSV are coupled to a timing strobe signal.

20. The scheme according to claim 11, wherein said pair of relative low loading TSVs and said (N−2) pairs of relative high loading TSVs are coupled to a input signal.

* * * * *